United States Patent
Song et al.

(10) Patent No.: US 11,393,993 B2
(45) Date of Patent: Jul. 19, 2022

(54) LAMINATE AND IMAGE DISPLAY DEVICE

(71) Applicants: Sumitomo Chemical Company, Limited, Tokyo (JP); Dongwoo Fine-Chem Co., Ltd., Pyeongtaek-si (KR)

(72) Inventors: Byunghoon Song, Pyeongtaek-si (KR); Youngjae Kim, Pyeongtaek-si (KR)

(73) Assignees: SUMITOMO CHEMICAL COMPANY, LIMITED, Tokyo (JP); DONGWOO FINE-CHEM CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/850,777

(22) Filed: Apr. 16, 2020

(65) Prior Publication Data
US 2020/0335713 A1    Oct. 22, 2020

(30) Foreign Application Priority Data

Apr. 17, 2019 (JP) .............................. JP2019-078603

(51) Int. Cl.
*G06F 3/045* (2006.01)
*H01L 51/00* (2006.01)
(Continued)

(52) U.S. Cl.
CPC .......... *H01L 51/0097* (2013.01); *G06F 3/045* (2013.01); *H01L 27/323* (2013.01);
(Continued)

(58) Field of Classification Search
CPC ...... G06F 3/044; G06F 3/0412; G06F 3/0446; G06F 2203/04102; G06F 2203/04103; G06F 3/0443; G06F 2203/04105
See application file for complete search history.

(56) References Cited

U.S. PATENT DOCUMENTS

| 7,491,758 B2 * | 2/2009 | Amano | ................... C09J 11/06 524/95 |
| 2009/0017298 A1 * | 1/2009 | Okada | ................... C08K 3/346 428/354 |

(Continued)

FOREIGN PATENT DOCUMENTS

| JP | 2009-173893 A | 8/2009 |
| JP | 2010-031223 A | 2/2010 |

(Continued)

OTHER PUBLICATIONS

Office Action dated Oct. 6, 2020 in JP Application No. 2019078603.
(Continued)

*Primary Examiner* — Olga V Merkoulova
(74) *Attorney, Agent, or Firm* — Panitch Schwarze Belisario & Nadel LLP

(57) ABSTRACT

A laminate including an optical film, a touch sensor layer, and a pressure-sensitive adhesive layer, the laminate being excellent in flexibility and high in response speed, is provided. A flexible laminate is provided, the flexible laminate including an optical film and a touch sensor layer including a transparent electrode layer, the flexible laminate being provided with a pressure-sensitive adhesive layer on a surface of the touch sensor layer opposite to the optical film, the flexible laminate satisfying conditions of surface resistance of the transparent electrode layer being ≤90 Ω/□, relative permittivity of the pressure-sensitive adhesive layer at a frequency of 100 kHz being ≤4.5, and 5 μm≤a thickness of the pressure-sensitive adhesive layer≤90 μm.

11 Claims, 3 Drawing Sheets

(51) Int. Cl.
  *H01L 27/32* (2006.01)
  *H01L 51/56* (2006.01)
  *H01L 51/52* (2006.01)
(52) U.S. Cl.
  CPC ...... *H01L 27/3244* (2013.01); *H01L 51/0024* (2013.01); *H01L 51/5281* (2013.01); *H01L 51/56* (2013.01); *H01L 2251/5338* (2013.01)

(56) References Cited

U.S. PATENT DOCUMENTS

| | | | | |
|---|---|---|---|---|
| 2009/0163626 | A1* | 6/2009 | Ukei | C09J 7/385 524/99 |
| 2009/0257003 | A1* | 10/2009 | Yoshihara | G02B 5/3083 359/507 |
| 2009/0317635 | A1* | 12/2009 | Amano | C09J 9/02 524/99 |
| 2010/0284072 | A1* | 11/2010 | Saitou | G02B 1/14 428/41.5 |
| 2011/0245364 | A1* | 10/2011 | Song | C08F 220/1804 522/75 |
| 2011/0311810 | A1* | 12/2011 | Yamagata | C09J 183/12 524/401 |
| 2011/0315306 | A1* | 12/2011 | Goto | G02B 5/3033 156/229 |
| 2012/0157611 | A1* | 6/2012 | Katami | C09J 7/385 524/558 |
| 2012/0251739 | A1* | 10/2012 | Kato | G02B 1/14 428/1.33 |
| 2013/0120314 | A1* | 5/2013 | Ishibashi | G06F 3/0412 345/174 |
| 2013/0160938 | A1* | 6/2013 | Yasui | G02B 5/3025 427/163.1 |
| 2014/0377550 | A1* | 12/2014 | Yasui | C09J 7/385 428/354 |
| 2015/0109231 | A1 | 4/2015 | Shirai et al. | |
| 2015/0293287 | A1* | 10/2015 | Yasui | G02B 5/3033 428/354 |
| 2016/0070383 | A1* | 3/2016 | Toyoshima | G02B 5/30 345/174 |
| 2016/0196894 | A1* | 7/2016 | Matsuda | H01B 3/447 428/500 |
| 2017/0101560 | A1* | 4/2017 | Mitsui | G06F 3/044 |
| 2017/0349790 | A1* | 12/2017 | Todaka | C09J 201/00 |
| 2018/0267351 | A1* | 9/2018 | Yamamoto | G06F 3/0412 |
| 2018/0297341 | A1* | 10/2018 | Ueki | G09F 9/30 |
| 2019/0091970 | A1* | 3/2019 | Ueki | B32B 27/365 |
| 2019/0255818 | A1* | 8/2019 | Ueki | G09F 9/00 |
| 2019/0324598 | A1* | 10/2019 | Ueki | H05B 33/02 |
| 2019/0383973 | A1* | 12/2019 | Jang | G06F 1/1652 |
| 2020/0201094 | A1* | 6/2020 | Lim | G02F 1/13306 |
| 2020/0335713 | A1* | 10/2020 | Song | G06F 3/045 |

FOREIGN PATENT DOCUMENTS

| | | |
|---|---|---|
| JP | 2012-140605 A | 7/2012 |
| JP | 2013-033248 A | 2/2013 |
| JP | 2013-033249 A | 2/2013 |
| JP | 2013-037353 A | 2/2013 |
| JP | 2013-101328 A | 5/2013 |
| JP | 2014-205244 A | 10/2014 |
| JP | 2015229687 A | 12/2015 |
| JP | 2016103266 A | 6/2016 |
| JP | 2019035092 A | 3/2019 |
| KR | 10-2013-0037598 A | 4/2013 |
| WO | 2018155940 A1 | 8/2018 |

OTHER PUBLICATIONS

Lub et al, "The synthesis of liquid-crystalline diacrylates derived from cyclohexane units," Recueil des Travaux Chimiques des Pays-Bas, 115/06, pp. 321-328 (1996) (cited in Specification).

Office Action dated Feb. 24, 2021 in JP Application No. 2019078603.

* cited by examiner

LAMINATE AND IMAGE DISPLAY DEVICE

CROSS-REFERENCE TO RELATED APPLICATIONS

This application claims priority under 35 U.S.C. § 119(b) to Japanese Application No. 2019-078603 filed Apr. 17, 2019, the disclosure of which is incorporated herein by reference in its entirety.

BACKGROUND OF THE INVENTION

Field of the Invention

The present invention relates to a laminate and an image display device including the same.

Description of the Background Art

Korean Patent Publication No. 10-2013-0037598 and Japanese Patent Laying-Open No. 2012-140605 have proposed a pressure-sensitive adhesive composition for a touch panel having a specific dielectric constant.

Japanese Patent Laying-Open No. 2014-205244 discloses a translucent conductive laminate including a first resin layer, a second resin layer, a conductive layer, and a substrate layer in this order, the first resin layer and the second resin layer having specific relative permittivity.

SUMMARY OF THE INVENTION

An object of the present invention is to provide a laminate including an optical film, a touch sensor layer, and a pressure-sensitive adhesive layer, the laminate being excellent in flexibility and high in response speed.

The present invention provides a laminate and an image display device below,

[1] A laminate includes an optical film and a touch sensor layer including a translucent electrode layer, the laminate is provided with a pressure-sensitive adhesive layer on a surface of the touch sensor layer opposite to the optical film, and the laminate satisfies expressions (1) to (3) below:

$$\text{surface resistance of the translucent electrode layer} \leq 90\ \Omega/\square \quad (1);$$

$$\text{relative permittivity of the pressure-sensitive adhesive layer at a frequency of 100 kHz} \leq 4.5 \quad (2); \text{ and}$$

$$5\ \mu m \leq \text{a thickness of the pressure-sensitive adhesive layer} \leq 90\ \mu m \quad (3).$$

[2] The laminate according to [1] further includes a front plate arranged on a side of the optical film opposite to the touch sensor layer.

[3] The laminate according to [1] or [2], in which the optical film includes a circular polarization plate.

[4] The laminate according to any one of [1] to [3] further includes an organic EL display element arranged on a side of the pressure-sensitive adhesive layer opposite to the touch sensor layer.

[5] The laminate according to any one of [1] to [4], in which the touch sensor layer includes a capacitance coupling type touch sensor panel.

[6] An image display device including the laminate according to any one of [1] to [5].

According to the present invention, a laminate including an optical film, a touch sensor layer, and a pressure-sensitive adhesive layer, the laminate being excellent in flexibility and high in response speed, can be provided.

The foregoing and other objects, features, aspects and advantages of the present invention will become more apparent from the following detailed description of the present invention when taken in conjunction with the accompanying drawings,

DESCRIPTION OF THE PREFERRED EMBODIMENTS

Figure 1:
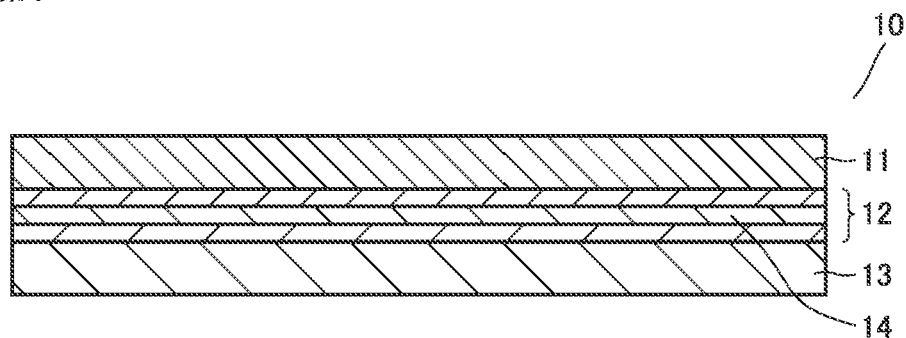
FIGS. 1 and 2 are schematic cross-sectional views each showing a laminate according to one embodiment of the present invention.

Though an embodiment of the present invention will be described below with reference to the drawings, the present invention is not limited to the embodiment below. In all drawings below, each component is scaled as appropriate for better understanding thereof, and the scale of each component shown in the drawings and the actual scale of the component do not necessarily match with each other.

<Laminate>

First Embodiment

FIG. 1 is a schematic cross-sectional view showing a laminate according to a first embodiment of the present invention. A laminate 10 shown in FIG. 1 includes an optical film 11, a touch sensor layer 12, and a pressure-sensitive adhesive layer 13 in this order. Touch sensor layer 12 includes a translucent electrode layer 14.

Flexibility means being bendable without a crack and break. Flexibility preferably means being bendable with a radius of bending of an inner surface of a laminate being set to 3 mm, and more preferably means that there is no crack or break even when bending with a radius of bending of the inner surface of the laminate being set to 3 mm is performed one hundred thousand times.

Laminate 10 satisfies expressions (1) to (3) below:

$$\text{surface resistance of the translucent electrode layer} \leq 90\ \Omega/\square \quad (1);$$

$$\text{relative permittivity of the pressure-sensitive adhesive layer at a frequency of 100 kHz} \leq 4.5 \quad (2); \text{ and}$$

$$5\ \mu m \leq \text{a thickness of the pressure-sensitive adhesive layer} \leq 90\ \mu m \quad (3).$$

As laminate 10 satisfies the expressions (1) to (3), both of flexibility and a response speed can be achieved.

When the surface resistance of translucent electrode layer 14 of touch sensor layer 12 exceeds 90 $\Omega/\square$, the response speed of the touch sensor is less likely to improve. Examples of a method for translucent electrode layer 14 to satisfy the expression (1) include a method of selecting a material for forming translucent electrode layer 14 and adjusting a thickness of translucent electrode layer 14 in forming translucent electrode layer 14 and a method of adjusting an amount of oxygen in formation of an ITO film in an example where translucent electrode layer 14 is formed from an ITO film.

From a point of view of the response speed of the touch sensor, the surface resistance of translucent electrode layer 14 is preferably not higher than 80 $\Omega/\square$, more preferably not higher than 70 $\Omega/\square$, and further preferably not higher than 60 $\Omega/\square$. The surface resistance of translucent electrode layer 14 can normally be not lower than 1 $\Omega/\square$.

When relative permittivity of pressure-sensitive adhesive layer 13 at a frequency of 100 kHz exceeds 4.5, the response speed of the touch sensor is less likely to improve. Pressure-sensitive adhesive layer 13 can be composed of a material having a dielectric constant satisfying the expression (2).

From a point of view of the response speed of the touch sensor, relative permittivity of pressure-sensitive adhesive layer 13 at a frequency of 100 kHz is preferably not higher than 3.5, more preferably not higher than 3.0, and further preferably not higher than 2.5. Relative permittivity of pressure-sensitive adhesive layer 13 at the frequency of 100 kHz can normally be higher than 1.

When a thickness of pressure-sensitive adhesive layer 13 exceeds 90 μm, flexibility is less likely to improve. When the thickness of pressure-sensitive adhesive layer 13 is smaller than 5 μm, the response speed of the touch sensor is less likely to improve.

From a point of view of flexibility of laminate 10 and the response speed of the touch sensor, the thickness of pressure-sensitive adhesive layer 13 is preferably not smaller than 5 μm and not larger than 70 μm, more preferably not smaller than 5 μm and not larger than 50 μm, and further preferably not smaller than 10 μm and not larger than 30 μm.

Though the thickness of laminate 10 is not particularly limited because the thickness is different depending on a function required of laminate 10 and an application of laminate 10, the thickness may be, for example, not smaller than 20 μm and not larger than 1000 μm, and from a point of view of flexibility of laminate 10, the thickness is preferably not smaller than 25 μm and not larger than 500 μm and more preferably not smaller than 30 μm and not larger than 300 μm.

Laminate 10 may be in, for example, a quadrangular shape, preferably a quadrangular shape having a long side and a short side, and more preferably a rectangular shape, in a plan view. When laminate 10 has a rectangular shape in the plan view, a length of the, long side may be, for example, not smaller than 10 mm and not larger than 1400 mm and preferably not smaller than 50 mm and not larger than 600 mm. A length of the short side is, for example, not smaller than 5 mm and not larger than 800 mm, preferably not smaller than 30 mm and not larger than 500 mm, and more preferably not smaller than 50 mm and not larger than 300 mm. The plan view herein means a view in a direction of a thickness of a layer.

When laminate 10 has the quadrangular shape in the plan view, sides of each layer that forms laminate 10 may be equal in length. Each layer that forms laminate 10 may have a corner rounded, may have an end notched, or may be punched.

Laminate 10 may further include a front plate, a bonding layer, an organic EL display element, and/or a separator.

Laminate 10 can be used, for example, for an image display device. The image display device is not particularly limited, and examples of the image display device include an organic electroluminescence (organic EL) display device, an inorganic electroluminescence (inorganic EL) display device, a liquid crystal display device, and an electroluminescent display device. When laminate 10 is bendable, laminate 10 is suitable for a flexible display.

[Optical Film]

An optical member normally used for an image display device may be used for an optical film. Examples of the optical member include a polarization layer, a thermoplastic resin film (for example, a polarizer protective film or a peelable film in a linear polarization plate), and a film with pressure-sensitive adhesive.

(Polarization Layer)

The polarization layer may be a linear polarization layer or a combination of a linear polarization layer and a retardation layer. Examples of the linear polarization layer include a film including as a polarizer, a stretched film or a stretched layer to which a dichroic dye has adsorbed or a layer obtained by applying a composition containing a dichroic dye and a polymerizable compound and curing the composition. Specifically, iodine or a dichroic organic dye is employed as the dichroic dye. The dichroic organic dye encompasses a dichroic direct dye composed of a dis-azo compound such as C. I. DIRECT RED 39 and a dichroic direct dye composed of a compound such as a tris-azo compound and a tetrakis-azo compound.

Examples of the layer obtained by applying a composition containing a dichroic dye and a polymerizable compound and curing the composition include a layer containing a cured product of a polymerizable liquid crystal compound such as a layer obtained by applying a composition containing a dichroic dye having liquid crystallinity or a composition containing a dichroic dye and a polymerizable liquid crystal compound and curing the composition.

The layer obtained by applying a composition containing a dichroic dye and a polymerizable compound and curing the composition is preferred because it is not restricted in a direction of bending as compared with a stretched film or a stretched layer to which a dichroic dye has adsorbed. Therefore, in obtaining a laminate that is not cracked when the number of times of bending is within the above-described range in repeated bending at least in one in-plane direction and a direction orthogonal thereto and additionally in all in-plane directions, a layer including as a polarizer, a layer obtained by applying a composition containing a dichroic dye and a polymerizable compound and owing the composition is preferred as the linear polarization layer.

(1) Linear Polarization Layer Including Polarizer Made From Stretched Film or Stretched Layer The polarizer made from a stretched film to which a dichroic dye has adsorbed can normally be manufactured in steps of uniaxially stretching a polyvinyl alcohol based resin film, adsorbing a dichroic dye by dyeing the polyvinyl alcohol based resin film with the dichroic dye, treating the polyvinyl alcohol based resin film to which the dichroic dye has adsorbed with a boric acid aqueous solution, and washing the polyvinyl alcohol based resin film with water after treatment with the boric acid aqueous solution. Such a polarizer may be used as the linear polarization layer as it is, or a polarizer having one surface or opposing surfaces bonded to a transparent protective film may be used as the linear polarization layer, The polarizer has a thickness preferably not smaller than 2 μm and not larger than 40 μm.

A polyvinyl alcohol based resin is obtained by saponifying a polyvinyl acetate based resin. Polyvinyl acetate which is a homopolymer of vinyl acetate and a copolymer of vinyl acetate and another monomer copolymerizable therewith are employed as the polyvinyl acetate based resin. Examples of another monomer copolymerizable with vinyl acetate include unsaturated carboxylic acid, olefin, vinyl ether, unsaturated sulfonic acid, and (meth)acrylamide having an ammonium group.

A degree of saponification of the polyvinyl alcohol based resin is normally from 85 to 100 mol % and preferably not lower than 98 mol %. The polyvinyl alcohol based resin may be modified, and for example, polyvinyl formal or polyvinyl acetal modified by aldehyde can also be used. A degree of polymerization of the polyvinyl alcohol based resin is normally not lower than 1000 and not higher than 10000 and preferably not lower than 1500 and not higher than 5000.

The polarizer made from a stretched layer to which a dichroic dye has adsorbed can normally be manufactured in steps of applying an application solution containing a polyvinyl alcohol based resin onto a substrate film, uniaxially stretching the obtained laminate film, obtaining a polarizer by adsorbing a dichroic dye by dyeing a polyvinyl alcohol based resin layer of the uniaxially stretched laminate film with the dichroic dye, treating the film to which the dichroic dye has adsorbed with a boric acid aqueous solution, and washing the film with water after treatment with the boric acid aqueous solution.

The substrate film may be removed by peel-off from the polarizer as necessary. The substrate film may be identical in material and thickness to a thermoplastic resin film which will be described later.

The polarizer made from a stretched film or a stretched layer may be incorporated in an optical laminate with a thermoplastic resin film being bonded to one surface or opposing surfaces thereof. The thermoplastic resin film can function as a protective film for the polarizer or a retardation film.

The thermoplastic resin film can be composed, for example, of: a polyolefin based resin such as chain polyolefin based resin (a polypropylene based resin or the like) and a cyclic polyolefin based resin (a norbornene based resin or the like); a cellulose based resin such as triacetyl cellulose; a polyester based resin such as polyethylene terephthalate, polyethylene naphthalate, and polybutylene terephthalate; a polycarbonate based resin; a (meth)acrylic resin; or a mixture thereof.

From a point of view of decrease in thickness, the thermoplastic resin film has a thickness normally not larger than 300 μm, preferably not larger than 200 μm, more preferably not larger than 100 μm, further preferably not larger than 80 μm, and still further preferably not larger than 60 μm, and normally not smaller than 5 μm and preferably not smaller than 20 μm.

The thermoplastic resin film may or may not have a phase difference.

The thermoplastic resin film can be bonded to the polarizer, for example, with an adhesive layer being interposed.

(2) Linear Polarization Layer Including as Polarizer, Film Obtained by Applying Composition Containing Dichroic Dye and Polymerizable Compound and Curing the Composition Examples of the film obtained by applying a composition containing a dichroic dye and a polymerizable compound and curing the composition include a film containing a cured product of a polymerizable liquid crystal compound such as a layer obtained by applying a composition containing a polymerizable dichroic dye having liquid crystallinity or a composition containing a dichroic dye and polymerizable liquid crystal to a substrate film (or an alignment film formed on the substrate film) and curing the composition.

The film may be used as the linear polarization layer with a substrate being peeled off therefrom or together with the substrate. The substrate film may be similar in material and thickness to the thermoplastic resin film described above.

The film obtained by applying a composition containing a dichroic dye and a polymerizable compound and curing the composition may be incorporated in a laminate with a thermoplastic resin film being bonded to one surface or opposing surfaces thereof. A film similar to a thermoplastic resin film that can be used for a polarizer made from a stretched film or a stretched layer can be used for the thermoplastic resin film.

The thermoplastic resin film can be bonded to the polarizer, for example, with an adhesive layer being interposed.

Examples of the film obtained by applying a composition containing a dichroic dye and a polymerizable compound and curing the composition specifically include a film described in Japanese Patent Laying-Open No. 2013-37353 or Japanese Patent Laying-Open No. 2013-33249.

The film obtained by applying a composition containing a dichroic dye and a polymerizable compound and curing the composition has a thickness normally not larger than 10 μm, preferably not smaller than 0.5 μm and not larger than 8 μm, and more preferably not smaller than 1 μm and not larger than 5 μm.

The polarization layer has a thickness, for example, not smaller than 2 μm and not larger than 100 μm and preferably not smaller than 10 μm and not larger than 60 μm.

The polarization layer may further include a retardation layer. The retardation layer can include one retardation layer or two or more retardation layers. A positive A plate and a positive C plate such as a λ/4 layer or a λ/2 layer can be adopted as the retardation layer. The retardation layer may be formed from a resin film mentioned as an exemplary material for the protective film described above or a layer obtained by curing a polymerizable liquid crystal compound. The polarization layer may further include an alignment film or a substrate film.

When the polarization layer includes a retardation layer, the linear polarization layer and the retardation layer can be bonded to each other with a bonding layer which will be described later being interposed. The thickness of the bonding layer may be, for example, not smaller than 0.5 μm and not larger than 25 μm and the thickness is preferably not smaller than 1 μm and not larger than 10 μm.

When the linear polarization layer (polarizer) and the retardation layer are arranged such that a prescribed angle is formed between an absorption axis of the linear polarization layer (polarizer) and a slow axis of the retardation layer, the polarization layer can have an antireflection function, that is, can function as a circular polarization plate. When the retardation layer includes a λ/4 layer, an angle formed between the absorption axis of the linear polarization layer (polarizer) and the slow axis of the λ/4 layer can be 45°±10°.

As laminate 10 includes the circular polarization plate as the polarization layer, reflection of external light can be prevented. The circular polarization plate has a thickness, for example, not smaller than 10 μm and not larger than 200 μm and preferably not smaller than 10 μm and not larger than 100 μm.

From a point of view of decrease in thickness, less shrinkage, and bendability of a laminate 100, the polarization layer preferably contains a polymer of a polymerizable liquid crystal compound.

When the polarization layer includes a retardation layer, the linear polarization layer may include a protective layer on a surface thereof to be located on a side of the retardation layer. The protective layer may be formed from a resin film mentioned as an exemplary material for the substrate layer or a coating-type protective layer. The coating-type protective layer may be obtained, for example, by applying a cation curable composition such as an epoxy resin or a radical curable composition such as (meth)acrylate and curing the composition, or by applying an aqueous solution of a polyvinyl alcohol based resin or the like and drying the aqueous solution, and, may contain a plasticizer, an ultraviolet absorbent, an infrared absorbent, a coloring agent such as a pigment or a dye, a fluorescent brightener, a dispersant, a thermal stabilizer, a light stabilizer, an antistatic agent, an antioxidant, or a lubricant as necessary.

A thickness of the protective layer may be, for example, not larger than 200 µm and the thickness is preferably not smaller than 0.1 µm and not larger than 100 µm.

[Touch Sensor Layer]

Touch sensor layer 12 should only be of a type capable of detecting a touch position on a front plate which will be described later and exemplary types include a capacitance coupling type. A capacitance coupling type touch sensor panel is suitably employed because of its low cost and high sensitivity to touch.

An exemplary capacitance coupling type touch sensor panel is constituted of a substrate layer, a position detection translucent electrode layer provided on the substrate layer, and a touch position sensing circuit. In an image display device provided with the capacitance coupling type touch sensor panel, for example, when a surface of the front plate which will be described later is touched, a translucent electrode is grounded at a touched point by a capacitance of a human body. The touch position sensing circuit senses grounding of the translucent electrode and the touched position is detected.

Touch sensor layer 12 may be configured, for example, in such a manner that a resistive film type or a capacitance coupling type touch sensor panel is formed on a glass plate with a separation layer being interposed, the glass plate is separated from the separation layer, and a substrate layer is provided on the separation layer, or in such a manner that the glass plate is separated from the separation layer to expose the separation layer as the outermost surface. The touch sensor panel may further include a substrate layer, an insulating layer, a protective layer, an interconnection, and an adhesive layer in addition to translucent electrode layer 14.

(Translucent Electrode Layer)

Translucent electrode layer 14 is not particularly restricted so long as it has surface resistance not higher than 90 Ω/□, and may be composed of metal oxide such as indium tin oxide (ITO) or made from a metal layer composed of a metal such as aluminum, copper, silver, gold, palladium, or an alloy thereof [for example, an Ag—Pd—Cu alloy (APC)]. Translucent electrode layer 14 may be patterned by photolithography. Touch sensor layer 12 may include one translucent electrode layer 14 or two or more translucent electrode layers 14. Translucent electrode layer 14 may be made from a single layer or multiple layers, and when the translucent electrode layer is made from multiple layers, a material for forming the layers may be identical or different in type. From a point of view of translucency and surface resistance, translucent electrode layer 14 is made preferably from a patterned ITO or APC film or a film obtained by combination thereof.

(Substrate Layer)

Examples of the substrate layer include a substrate film having translucent electrode layer 14 vapor deposited on one surface or a substrate film having translucent electrode layer 14 transferred with an adhesive layer being interposed. Alternatively, the substrate layer may be structured not to include another substrate film with a separation layer which will be described later serving as a substrate layer.

The substrate film is not limited so long as it is made from a resin film through which light can pass. Examples of the substrate film can include films known in the field of the art such as a cyclic polyolefin based resin film, a cellulose acetate based resin film composed of a resin such as triacetyl cellulose or diacetyl cellulose, a polyester based resin film composed of a resin such as polyethylene terephthalate, polyethylene naphthalate, or polybutylene terephthalate, a polycarbonate based resin film, a (meth)acrylic resin film, and a polypropylene based resin film. Among these, the cyclic polyolefin based resin film is preferred. The substrate film has a thickness normally not larger than 300 µm, preferably not larger than 200 µm, and more preferably not larger than 100 µm, and normally not smaller than 5 µm and preferably not smaller than 10 µm. The substrate layer may be removed from the touch sensor layer after the translucent electrode layer is incorporated in the touch sensor layer.

(Separation Layer)

The separation layer can be a layer that is formed on a substrate such as a lass plate, and serves to separate, together with the separation layer, translucent electrode layer 14 formed on the separation layer from the substrate. The separation layer is preferably made from an inorganic layer or an organic layer. Examples of a material for forming the inorganic layer include silicon oxide. Examples of a material for forming the organic layer can include a (meth)acrylic resin composition, an epoxy based resin composition, and a polyimide based resin composition. The separation layer may be removed together with the substrate so as not to be incorporated in the touch sensor layer.

(Insulating Layer)

The insulating layer can be formed to cover translucent electrode layer 14. The insulating layer can be formed of at least one material selected from the group consisting of a curable prepolymer, a curable polymer, and a plastic polymer. The insulating layer can also be formed of a varnish type material that can form a film. The varnish type material can include at least one selected from the group consisting of polysilicone, polyimide, and a polyurethane material. The insulating layer can also be formed from an adhesive layer which will be described later. The insulating layer may be patterned by photolithography. The insulating layer may be formed from a single layer or multiple layers, and when the insulating layer is made from multiple layers, a material for forming the layers may be identical or different in type.

(Adhesive Layer)

Examples of the adhesive layer include an adhesive layer and a pressure-sensitive adhesive layer. The adhesive layer can contain at least one material selected from the group consisting of a polyester based resin, a polyether based resin, a polyurethane based resin, an epoxy based resin, a silicone based resin, and an acrylic resin.

(Interconnection)

An interconnection can be arranged in a touch sensor panel for electrical connection between a touch position sensing circuit and translucent electrode layer 14. The interconnection can be made from a patterned metal film. The metal film can be formed by patterning by photolithography and etching, a metal film formed by sputtering or vapor deposition of a metal such as aluminum, copper, silver, gold, or an alloy thereof. The interconnection can be provided on translucent electrode layer 14.

[Pressure-Sensitive Adhesive Layer]

Pressure-sensitive adhesive layer 13 is arranged on a surface of touch sensor layer 12 opposite to optical film 11. Pressure-sensitive adhesive layer 13 can be arranged as being in contact with touch sensor layer 12. Pressure-sensitive adhesive layer 13 can be a pressure-sensitive adhesive layer for layering a laminate on an organic EL display element. Pressure-sensitive adhesive layer 13 can be formed of a pressure-sensitive adhesive composition. Though pressure-sensitive adhesive layer 13 may be of a single-layered structure or a multiple-layered structure, it is preferably of the single-layered structure.

Any pressure-sensitive adhesive composition can be employed without being particularly limited so long as it satisfies the expression (2) described above when the pressure-sensitive adhesive layer is composed thereof. The pressure-sensitive adhesive composition may mainly be composed of a resin such as a (meth)acrylic resin, a rubber based resin, a urethane based resin, an ester based resin, a silicone based resin, or a polyvinyl ether based resin. Among these, a pressure-sensitive adhesive composition containing a (meth)acrylic resin excellent in translucency, weather resistance, and heat resistance as a base polymer is suitable. The pressure-sensitive adhesive composition may be curable by active energy rays or heat.

For example, a polymer or a copolymer containing as a monomer, one type or two or more types of (meth)acrylic ester such as butyl (meth)acrylate, methyl (meth)acrylate, ethyl (meth)acrylate, hexyl (meth)acrylate, octyl (meth)acrylate, lauryl (meth)acrylate, isooctyl (meth)acrylate, isodecyl (meth)acrylate, 2-ethyl hexyl (meth)acrylate, and isobornyl (meth)acrylate is suitably employed as the (meth)acrylic resin (base polymer) used for the pressure-sensitive adhesive composition.

A polar monomer is preferably copolymerized with the base polymer. Examples of the polar monomer can include a monomer containing a carboxyl group, a hydroxyl group, an amide group, an amino group, or an epoxy group, such as (meth)acrylic acid, 2-hydroxypropyl (meth)acrylate, hydroxyethyl (meth)acrylate, (meth)acrylamide, N,N-dimethylaminoethyl (meth)acrylate, or glycidyl (meth)acrylate.

Though the pressure-sensitive adhesive composition may contain only the base polymer, it normally further contains a cross-linking agent. Examples of the cross-linking agent include: a cross-linking agent that is composed of metal ions having a valence of two or more and forms metal salt of carboxylic acid between the cross-linking agent and a carboxyl group; a cross-linking agent that is composed of a polyamine compound and forms amide bond between the cross-linking agent and a carboxyl group; a cross-linking agent that is composed of a polyepoxy compound or polyol and forms ester bond between the cross-linking agent and a carboxyl group; and a cross-linking agent that is composed of a polyisocyanate compound and forms amide bond between the cross-linking agent and a carboxyl group. Among these, a polyisocyanate compound is preferred.

An active energy ray curable pressure-sensitive adhesive composition has a property of being cured by irradiation with active energy rays such as ultraviolet rays or electron beams, has pressure-sensitive adhesiveness also before irradiation with active energy rays and can be in intimate contact with an object such as a film, and has a property of being cured by irradiation with active energy rays as being variable in strength of intimate contact.

The active energy ray curable pressure-sensitive adhesive composition is preferably ultraviolet-ray curable. The active energy ray curable pressure-sensitive adhesive composition further contains an active energy ray polymerizable compound in addition to the base polymer and the cross-linking agent. The active energy ray curable pressure-sensitive adhesive composition may further contain a photopolymerization initiator or a photosensitizes as necessary.

Examples of the active energy ray polymerizable compound include a (meth)acrylic compound such as a (meth)acryloyloxy-group-containing compound such as a (meth)acrylate monomer containing at least one (meth)acryloyloxy group in a molecule and a (meth)acrylate oligomer containing at least two (meth)acryloyloxy groups in a molecule that is obtained by reaction of two or more types of functional-group-containing compounds.

The pressure-sensitive adhesive composition can contain an additive such as fine particles for providing a light scattering property, beads (resin beads or glass beads), glass fibers, a resin other than the base polymer, a tackifier, a filler (metal powders or other inorganic powders), an antioxidant, an ultraviolet absorbent, an antistatic agent, a dye, a pigment, a coloring agent, an antifoaming agent, an anticorrosive, and a photopolymerization initiator.

Pressure-sensitive adhesive layer 13 can be formed by applying, for example, an organic solvent diluent of the pressure-sensitive adhesive composition onto a substrate and drying the organic solvent diluent. When an active energy ray curable pressure-sensitive adhesive composition is employed, a cured product having a desired degree of curing can be obtained by irradiating the formed pressure-sensitive adhesive layer with active energy rays.

Second Embodiment

Figure 2:
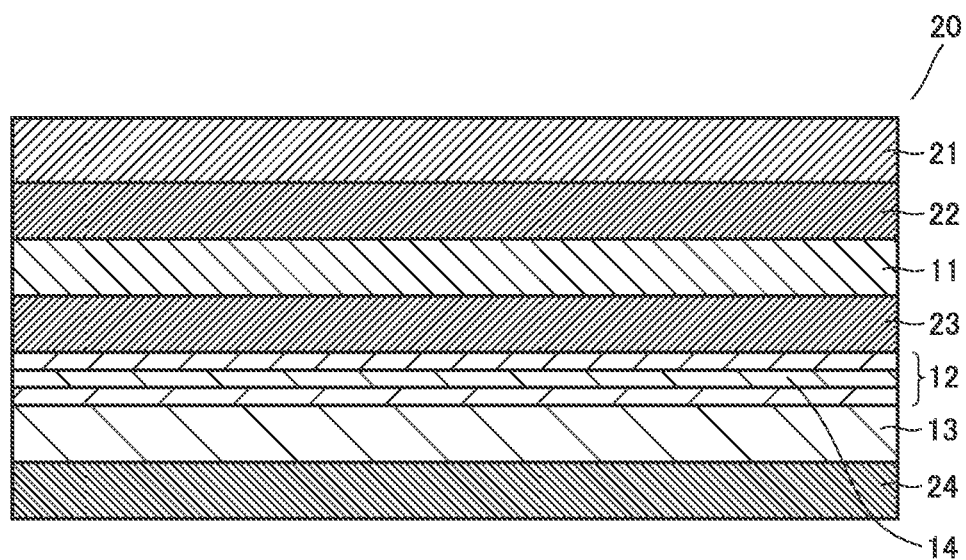

FIG. 2 is a schematic cross-sectional view of a laminate 20 according to a second embodiment of the present invention. Laminate 20 includes a front plate 21, a first bonding layer 22, optical film 11, a second bonding layer 23, touch sensor layer 12, pressure-sensitive adhesive layer 13, and an organic EL display element 24 in this order from a side of visual recognition. Touch sensor layer 12 includes translucent electrode layer 14.

[Front Plate]

Front plate 21 is arranged on a side of optical film 11 opposite to touch sensor layer 12. Front plate 21 is made preferably from a plate-shaped body through which light can pass. Front plate 21 may be formed from only a single layer or two or more layers. Front plate 21 can define the outermost surface of an image display device.

Examples of front plate 21 include a plate-shaped body made of glass (for example, a glass plate or a glass film) and a plate-shaped body made of a resin (for example, a resin plate, a resin sheet, or a resin film). Among these, from a point of view of flexibility of the laminate and the image display device including the same, a plate-shaped body made of a resin such as a resin film is preferred.

Examples of a thermoplastic resin for forming a plate-shaped body made of a resin such as a resin film include: a polyolefin based resin such as a chain polyolefin based resin (a polyethylene based resin, a polypropylene based resin, and a polymethylpentene based resin) and a cyclic polyolefin based resin (a norbornene based resin); a cellulose based resin such as triacetyl cellulose; a polyester based resin such as polyethylene terephthalate, polyethylene naphthalate, and polybutylene terephthalate; polycarbonate based resin; an ethylene-vinyl acetate based resin; a polystyrene based resin; a polyamide based resin; a polyether imide based resin; a (meth)acrylic resin such as a polymethyl (meth)acrylate resin; a polyimide based resin; a polyether sulfone based resin; a polysulfone based resin; a polyvinyl chloride based resin; a polyvinylidene chloride based resin; a polyvinyl alcohol based resin; a polyvinyl acetal based resin; a polyether ketone based resin; a polyether ether ketone based resin; a polyether sulfone based resin; and a polyamide-imide based resin.

The thermoplastic resin can be used alone or two or more types of thermoplastic resins may be used as being mixed.

Among these, from a point of view of flexibility, strength, and transparency, a polyimide based resin, a polyamide based resin, or a polyamide-imide based resin is suitably used as the thermoplastic resin that forms the front plate.

Front plate 21 may be made from a film having improved hardness by being provided with a hard coat layer on at least one surface of a substrate film. The resin film described above can be employed as the substrate film.

The hard coat layer may be formed on one surface or opposing surfaces of the substrate film. By providing the hard coat layer, hardness and resistance against scratching can be improved. The thickness of the hard coat layer may be, for example, not smaller than 0.1 µm and not larger than 30 µm, and it is preferably not smaller than 1 µm and not larger than 20 µm and more preferably not smaller than 5 µm and not larger than 15 µm.

The hard coat layer is made, for example, from a layer obtained by curing an ultraviolet curable resin. Examples of the ultraviolet curable resin include a (meth)acrylic resin, a silicone based resin, a polyester based resin, a urethane based resin, an amide based resin, and an epoxy based resin. The hard coat layer may contain an additive for improving strength. The additive is not limited and examples thereof include inorganic fine particles, organic fine particles, or a mixture thereof.

Front plate 21 not only performs a function to protect a front surface (screen) of the image display device (a function as a window film) but may perform a function as a touch sensor, a blue light cut-off function, or a viewing angle adjustment function.

A thickness of front plate 21 may be, for example, not smaller than 20 µm and not larger than 2000 µm, and the thickness is preferably not smaller than 25 µm and not larger than 1500 µm, more preferably not smaller than 30 µm and not larger than 1000 µm, further preferably not smaller than 40 µm and not larger than 500 µm, particularly preferably not smaller than 40 µm and not larger than 200 µm, and still further preferably not smaller than 40 µm and not larger than 100 µm.

[Bonding Layer]

First bonding layer 22 can be a layer interposed between front plate 21 and optical film 11 and can bond front plate 21 and optical film 11 to each other. Second bonding layer 23 is interposed between optical film 11 and touch sensor layer 12 and can bond optical film 11 and touch sensor layer 12 to each other. One bonding layer may be constituted of a single layer or two or more layers. First bonding layer 22 and second bonding layer 23 may be identical or different in type.

First bonding layer 22 and second bonding layer 23 can be formed of a pressure-sensitive adhesive or an adhesive that has conventionally been known. The pressure-sensitive adhesive may be made of a pressure-sensitive adhesive composition that forms pressure-sensitive adhesive layer 13 described above. The adhesive may be a water based adhesive or an active energy ray curable adhesive.

Examples of the water based adhesive include an adhesive composed of a polyvinyl alcohol based resin aqueous solution and a water-based two-component urethane based emulsion adhesive.

The active energy ray curable adhesive refers to an adhesive that is cured by irradiation with active energy rays such as ultraviolet rays, and examples thereof include an active energy ray curable adhesive containing a polymerizable compound and a photopolymerization initiator, an active energy ray curable adhesive containing a photoreactive resin, and an active energy ray curable adhesive containing a binder resin and a photoreactive cross-linking agent. Examples of the polymerizable compound include a photopolymerizable monomer such as a photocurable epoxy based monomer, a photocurable (meth)acrylic monomer, and a photocurable urethane based monomer and an oligomer derived from a photopolymerizable monomer. Examples of the photopolymerization initiator include an initiator containing a substance that generates active species such as neutral radicals, anionic radicals, or cationic radicals by irradiation with active energy rays such as ultraviolet rays. An active energy ray curable adhesive that contains a photocurable epoxy based monomer and a photo-cationic polymerization initiator can preferably be employed as the active energy ray curable adhesive containing a polymerizable compound and a photopolymerization initiator.

A thickness of first bonding layer 22 and second bonding layer 23 is, for example, not smaller than 3 µm and not larger than 100 µm and preferably not smaller than 5 µm and not larger than 50 µm, and the thickness may be not smaller than 20 µm.

[Organic EL Display Element]

A conventionally known organic EL display element can be employed as organic EL display element 24.

[Method of Manufacturing Laminate]

The laminate according to the present invention can be manufactured by bonding the optical film and the touch sensor layer to each other with the bonding layer being interposed and then bonding the pressure-sensitive adhesive layer to the outermost surface on the side of the touch sensor layer. In order to enhance an intimate contact property, surface activation treatment such as corona treatment or plasma treatment is preferably performed onto one or both of bonding surfaces.

When the optical film is made from a polarization layer, the polarization layer can be formed on the front plate or the substrate directly or with an alignment film being interposed. The substrate may be incorporated in the laminate or may be peeled off from the polarization layer without being a component of the laminate.

The touch sensor layer can be manufactured, for example, by a first or second method below.

In the first method, initially, a substrate layer is laminated on a glass plate with an adhesive layer being interposed. A translucent electrode layer and an interconnection are formed in this order on the substrate layer. By controlling a temperature, the glass substrate and the substrate layer are separated from each other, and a touch sensor layer constituted of the interconnection, the translucent electrode layer, and the substrate layer is obtained.

In the second method, initially, a separation layer is formed on a glass plate. A translucent electrode layer, an interconnection, and an insulating layer are formed in this order on the separation layer. A peelable thermoplastic resin film is laminated on the outermost surface opposite to the glass plate, layers from the insulating layer to the separation layer are transferred to the peelable thermoplastic resin film, and the glass plate is separated. A substrate layer is then prepared, and the substrate layer and the separation layer are bonded to each other with an adhesive layer being interposed. By peeling off the peelable thermoplastic resin film, a touch sensor layer including the insulating layer, the interconnection, the translucent electrode layer, the separation layer, the adhesive layer, and the substrate layer in this order is obtained. Another translucent electrode layer can also be formed on the insulating layer and yet another insulating layer can also be formed on that another translucent electrode layer.

A pressure-sensitive adhesive sheet can be prepared as the pressure-sensitive adhesive layer. The pressure-sensitive adhesive sheet can be made, for example, by preparing a pressure-sensitive adhesive solution by dissolving or dispersing a pressure-sensitive adhesive composition in an organic solvent such as toluene or ethyl acetate, forming a layer composed of a pressure-sensitive adhesive like a sheet on a peeling film subjected to release treatment, and bonding another peeling film onto the pressure-sensitive adhesive layer. The layers can be bonded by bonding the pressure-sensitive adhesive sheet from which one peeling film has been peeled off to one layer, peeling off the other peeling film, and bonding the other layer.

The method of manufacturing laminate 10 includes, for example, steps of preparing optical film 11, preparing touch sensor layer 12, preparing pressure-sensitive adhesive layer 13, bonding optical film 11 and touch sensor layer 12 to each other with the bonding layer being interposed, and bonding pressure-sensitive adhesive layer 13 to the outermost surface on the side of touch sensor layer 12, and the step of preparing touch sensor layer 12 can include the step of forming translucent electrode layer 14. In the step of forming translucent electrode layer 14, translucent electrode layer 14 can be formed by photolithography.

[Application of Image Display Device]

The image display device according to the present invention can be used for mobile devices such as smartphones and tablets, televisions, digital photo frames, digital signage, measurement instruments or meters, office appliances, medical instruments, and computing devices.

EXAMPLES

Though the present invention will be described below in further detail with reference to Examples, the present invention is not limited by these Examples. "%" and "part(s)" in the examples represent mass % and part(s) by mass, unless otherwise specified.

[Surface Resistance]

Surface resistance of the translucent electrode layer of the touch sensor layer was measured in conformity with JIS K7194 by using a surface resistance meter (Resitest-80 manufactured by Napson Corporation).

[Thickness of Layer]

Measurement was conducted by using a contact-type film thickness measurement apparatus ("MS-5C" manufactured by Nikon Corporation).

Measurement for a polarizer and an alignment film was conducted by using a laser microscope ("OLS 3000" manufactured by Olympus Corporation)

[Relative Permittivity]

Figure 3:
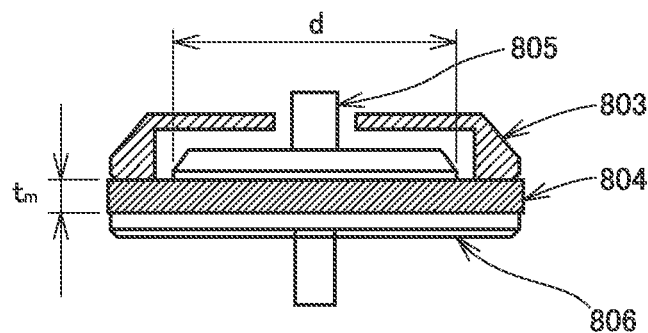
FIG. 3 is a schematic cross-sectional view showing a method of measuring relative permittivity.

Relative permittivity of the pressure-sensitive adhesive layer was measured by an electrode contact method shown in FIG. 3. The pressure-sensitive adhesive layer was layered to a thickness of 1 mm between a main electrode 805 and a counter electrode 806 of a dielectric material test fixture (dielectric material test fixture 16451B manufactured by Keysight Technologies) including main electrode 805, counter electrode 806, and a guard electrode 803, a measurement sample 804 was set, and a capacitance Cp was measured. Relative permittivity $\varepsilon_r$ of the pressure-sensitive adhesive at a frequency of 100 kHz was calculated in accordance with an expression below based on measured capacitance Cp.

$$\varepsilon_r = \frac{t_m \times C_p}{A \times \varepsilon_0} = \frac{t_m \times C_p}{\pi \left(\frac{d}{2}\right)^2 \times \varepsilon_0}$$

$C_p$: capacitance [F] of measurement sample
$t_m$: average thickness [m] of measurement sample
A: area [m$^2$] of main electrode
d: diameter [m] of main electrode
$\varepsilon_0$: dielectric constant of vacuum=8.854×10$^{-12}$ F/m The frequency and an environment for measurement were set to conditions below.

Frequency: 100 kHz
Environment for measurement: room temperature (23° C.) and relative humidity of 55%

[Capacitance Between Touch Sensor Layer and Organic EL Panel]

Capacitance C [pF] between the touch sensor layer and an organic EL panel was calculated in accordance with a mathematical expression below.

$$C = \varepsilon_0 \cdot \varepsilon_r \frac{A}{t}$$

$\varepsilon_0$: dielectric constant of vacuum=8.854 pF/m
$\varepsilon_r$: relative permittivity of pressure-sensitive adhesive layer
A: area [m$^2$] of pressure-sensitive adhesive layer
t: distance [m] between touch sensor layer and organic EL panel

[Response Speed]

A response speed was measured as below. An organic EL display element (having a thickness of 30 μm) was bonded to a surface of a laminate 600 obtained in Example and Comparative Example from which a separator 83 had been peeled off and a support substrate (a polyimide film having a thickness of 50 μm) was bonded to a surface on a side of the bonded organic EL display element with a pressure-sensitive adhesive layer (8146-1 having a thickness of 25 μm and manufactured by 3M Company) which will be described later being interposed. Each bonding surface was subjected to corona treatment.

The sample was coupled to a drive board XT748U (Atmel Corporation), a program of response speed measurement software [Atmel Studio 7 (Q touch Analyzer)] was executed, and thereafter the response speed was measured.

[Touch Sensor Pattern Visibility]

A visibility test was conducted as below. In the visibility test, in a darkroom, a laminate in Example and Comparative Example was arranged on an LED backlight (DSN-1200 manufactured by UP, an illumination of 3000 Lux) and observed with naked eyes from a side of the front plate. The laminate was arranged such that the touch sensor layer was located on the side of the backlight. Evaluation as "A" was made when a patterned conductive layer was not visually recognized and evaluation as "B" was made when the patterned conductive layer was visually recognized.

[Bendability]

Figure 4A:
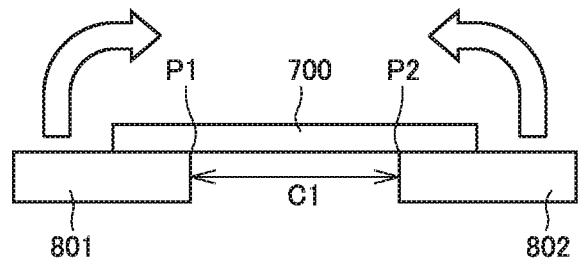
FIGS. 4A and 4B are schematic cross-sectional views showing a method of evaluating bendability.
Figure 4B:
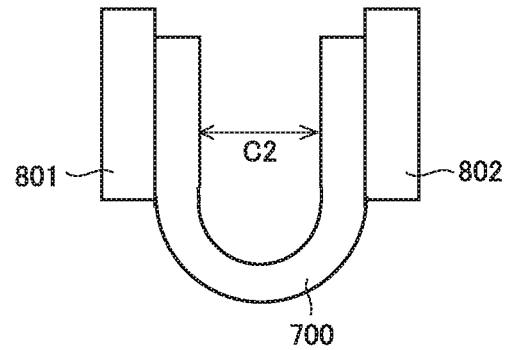

The laminate obtained in each of Example and Comparative Example was subjected to a bendability test as below. A laminate 700 was obtained by bonding a polyimide film (having a thickness of 38 μm) to a surface of laminate 600 obtained in Example and Comparative Example from which separator 83 had been peeled off and bonding a surface on the side of the bonded polyimide film to a pressure-sensitive adhesive surface of a support substrate with pressure-sensitive adhesive (the pressure-sensitive adhesive having a thickness of 25 μm and the support substrate formed from a polyimide film having a thickness of 50 μm). Each bonding surface was subjected to corona treatment. As shown in FIG. 4A, a bending apparatus (Tension-Free™ U-Shape Folding Test: DLDMLH-FS manufactured by Yuasa System Co., Ltd.) including two stages 801 and 802 was prepared, two stages 801 and 802 were arranged at a distance C1, and the laminate was fixed and arranged such that the center of laminate 700 in a width direction was located at the center of a gap C1 (FIG. 4A). At this time, laminate 700 was arranged on stages 801 and 802 such that the front plate faced up. Stages 801 and 802 can be moved with gap C1 between the two stages being defined as the center. Initially, two stages 801 and 802 were flush with each other. Two stages 801 and 802 were closed by being pivoted upward by ninety degrees with a position P1 and a position P2 being defined as the respective centers of rotation axes, bending force was applied to an area of laminate 700 corresponding to gap C1 in a carrier, and a distance C2 between opposing portions of the surface of the front plate was set to 6.0 mm (FIG. 4B). Thereafter, stages 801 and 802 were opened again (FIG. 4A). A series of operations above was defined as one bending. This operation was repeated and the number of times of bending until a first crack was produced in laminate 700 was counted. References for evaluation are as below.

A: one hundred thousand times or more
B: less than one hundred thousand times

[Corona Treatment]

Conditions in corona treatment performed in bonding of layers are as below.

Voltage: 8.6 kV
Treatment speed=6 m/min.
Gap=2 mm

<Preparation of Pressure-Sensitive Adhesive>

Pressure-sensitive adhesive 1: product name of LSP-1 available from Sekisui Chemical Co., Ltd.

Pressure-sensitive adhesive 2: product name of KBO-651-17117A available from KNW Co., Ltd.

Pressure-sensitive adhesive 3: product name of FCS024 available from Dai Nippon Printing Co., Ltd.

Pressure-sensitive adhesive 4: product name of HSV01NP available from Sekisui Chemical Co., Ltd.

<Preparation of Pressure-Sensitive Adhesive Sheet>

Pressure-sensitive adhesive 1 was applied to a peel-treated surface of a polyethylene terephthalate film (a light separator) with a knife coater. An application layer was formed by heat treatment at 90° C. for one minute. The application layer on the light separator obtained above and a polyethylene terephthalate film (a heavy separator) were bonded to each other such that a peel-treated surface of the separator was in contact with the application layer and the bonded member was cured for seven days under conditions of 23° C. and 50% RH. A pressure-sensitive adhesive sheet including a pressure sensitive adhesive layer having a thickness of 5 μm and composed of pressure-sensitive adhesive 1, that is, a pressure-sensitive adhesive sheet constituted of the light separator/the pressure-sensitive adhesive layer (having a Thickness of 5 μm)/the heavy separator, was thus made. A thickness and relative permittivity of the pressure-sensitive adhesive layer were measured in accordance with the method described above. Table 1 shows results.

A pressure-sensitive adhesive sheet was made as in preparation of the pressure-sensitive adhesive sheet described above except for forming a pressure-sensitive adhesive layer having a thickness shown in Table 1 by using a pressure-sensitive adhesive shown in Table 1.

<Preparation of Pressure-Sensitive Adhesive Sheets a and b>

On mass basis, 84 parts of 2-ethylhexyl acrylate, 15 parts of isobornyl acrylate, 1 part of hydroxypropyl acrylate, and 0.02 part of 1-hydroxycyclohexyl phenyl ketone as a polymerization initiator were mixed. Monomers were polymerized by irradiating a solution mixture with ultraviolet rays.

Thereafter, a pressure-sensitive adhesive composition a was prepared by adding 0.4 part of 1-hydroxycyclohexyl phenyl ketone as a polymerization initiator, 0.3 part of lauryl acrylate, 0.05 part of poly(ethylene glycol) (200) diacrylate, and 0.05 part of (3-glycidyloxypropyl)trimethoxysilane to the solution mixture.

Pressure-sensitive adhesive sheet a constituted of the light separator/a pressure-sensitive adhesive layer a (having a thickness of 25 μm)/the heavy separator was made as in preparation of pressure-sensitive adhesive sheet 1 described above, except for using pressure-sensitive adhesive composition a and setting a thickness of the pressure-sensitive adhesive layer to 25 μm.

Similarly, a pressure-sensitive adhesive sheet b constituted of the light separator/a pressure-sensitive adhesive layer b (having a thickness of 5 μm)/the heavy separator was made by using pressure-sensitive adhesive composition a and setting a thickness of the pressure-sensitive adhesive layer to 5 μm.

<Preparation of Front Plate A>

A front plate A (having a total thickness of 70 μm) including a hard coat layer (having a thickness of 10 μm) formed on each of opposing surfaces of a polyimide resin film (having a thickness of 50 μm) with a composition containing a dendrimer compound having a polyfunctional acrylic group at a terminal was prepared.

<Preparation of Laminate A>

By bonding a peeling film on each of opposing surfaces of front plate A, a laminate A including from plate A that is constituted of the peeling film/front plate A (having a thickness of 70 μm)/the peeling film was made.

<Preparation of Circular Polarization Plate>

[Optical Alignment Film Forming Composition]

An optical alignment film forming composition (1) was obtained by mixing components below and agitating the obtained mixture at 80° C. for one hour. A photoalignable material shown in a formula below was synthesized by a method described in Japanese Patent Laying-Open No. 2013-33248.

Photoalignable material (5 parts):

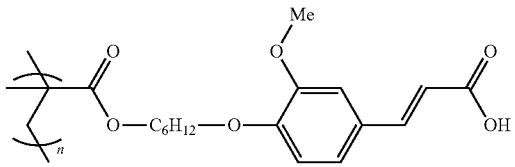

Solvent (95 parts): cyclopentanone

[Polarizer Forming Composition]

A polymerizable liquid crystal compound expressed in a formula (1-6) [which is also referred to as a compound (1-6) below] and a polymerizable liquid crystal compound expressed in a formula (1-7) [which is also referred to as a compound (1-7) below] were employed as polymerizable liquid crystal compounds.

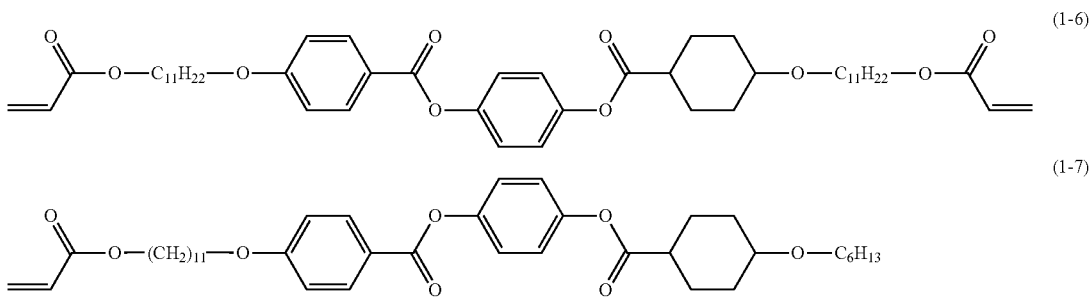

The compound (1-6) and the compound (1-7) were synthesized by a method described in Lub et al., Recl. Trav. Chim. Pays-Bas, 115, 321-328 (1996), Azo dyes described in Example in Japanese Patent Laying-Open No. 2013-101328 shown in formulae (2-1a), (2-1b), and (2-3a) below were employed as dichroic dyes.

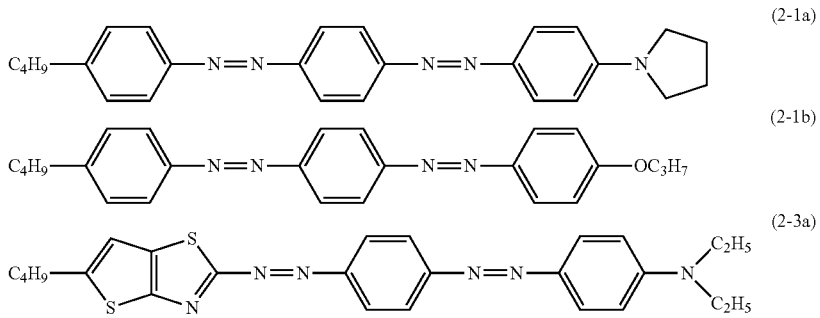

The polarizer forming composition was prepared by mixing 75 parts of the compound (1-6), 25 parts of the compound (1-7), 2.5 parts of each of the azo dyes shown in the formulae (2-1a), (2-1b), and (2-3a) as a dichroic dye, 6 parts by mass of 2-dimethylamino-2-benzyl-1-(4-morpholinophenyl)butane-1-one (Irgacure 369 manufactured by BASF Japan Ltd.) as a polymerization initiator, and 1.2 part of a polyacrylate compound (BYK-361N manufactured by BYK-Chemie GmbH) as a leveling agent into 400 parts of toluene as a solvent and agitating the obtained mixture at 80° C. Tor one hour.

[Linear Polarization Layer]

An alignment film forming composition was applied onto a substrate layer (TAC) by bar coating, This coating was dried at 80° C. for one minute. Then, the coating was irradiated with polarized UV by using an UV irradiation apparatus and a wire grid to provide alignment performance to the coating. Exposure was set to 100 mJ/cm$^2$ (with 365 nm being defined as the reference wavelength). UIS-27132## (manufactured by Ushio Inc.) was employed as the wire grid. The alignment film was thus formed. The alignment film had a thickness of 100 nm.

A polarizer forming composition was applied onto the formed alignment film by bar coating. This coating was dried by heating at 100° C. for two minutes and thereafter cooled to a room temperature. A polarizer was formed by irradiating the coating with ultraviolet rays at an accumulated quantity of light of 1200 mJ/cm$^2$ (with 365 nm being defined as the reference wavelength) by using the UV irradiation apparatus. The obtained polarizer had a thickness of 3 µm. A protective layer was formed by coating the polarizer with a composition containing polyvinyl alcohol and water such that the composition had a thickness after drying of 0.5 µm) and drying the composition at a temperature of 80° C. for three minutes. A linear polarization layer including the substrate layer/the alignment film/the polarizer/the protective layer in this order was thus made.

[Retardation Layer 1]

A horizontal alignment film forming composition was obtained by mixing 5 parts of a photoalignable material (having a weight average molecular weight of 30,000) having a structure below and 95 parts of cyclopentanone and agitating the obtained mixture at 80° C. for one hour.

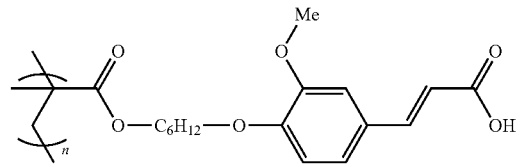

To 100 parts of a mixture obtained by mixing a polymerizable liquid crystal compound A and a polymerizable liquid crystal compound B shown below at a mass ratio of 90:10, 1.0 part of a leveling agent (F-556 manufactured by DIC Corporation) and 6 parts of 2-dimethylamino-2-benzyl-1-(4-morpholinophenyl)butane-1-one ("Irgacure 369 (Irg 369)" manufactured by BASF Japan Ltd.) as a polymerization initiator were added.

A retardation layer forming composition (1) was obtained by further adding N-methyl-2-pyrrolidone (NMP) such that a solid content attained to 13% and agitating the mixture at 80° C. for one hour.

The polymerizable liquid crystal compound A. was manufactured by a method described in Japanese Patent Laying- Open No. 2010-31223. The polymerizable crystal compound B was manufactured in accordance with a method described in Japanese Patent Laying-Open No. 2009-173893. A molecular structure of each of them is shown below.

(Polymerizable Liquid Crystal Compound A)

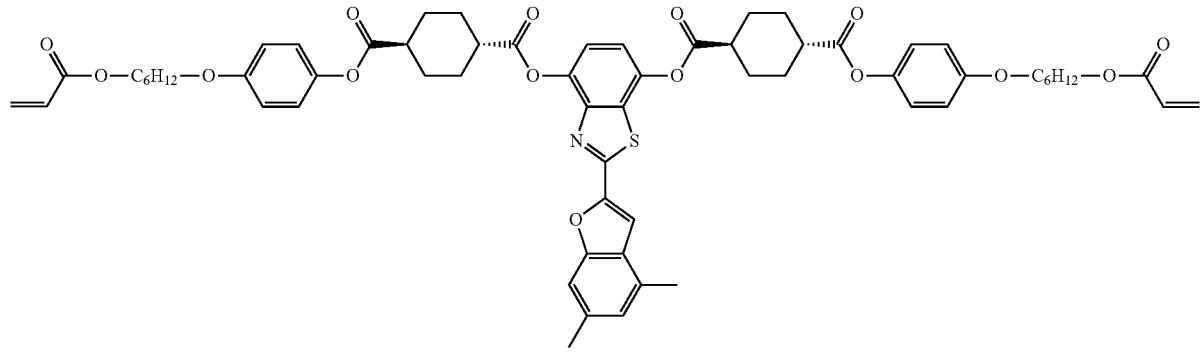

(Polymerizable Liquid Crystal Compound B)

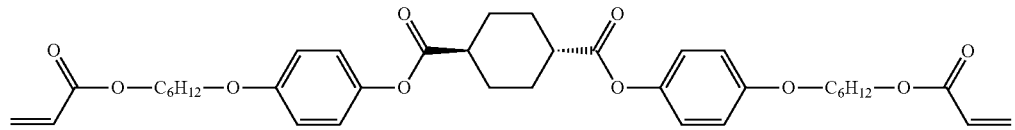

A polyethylene terephthalate (PET) substrate film having a thickness of 38 μm was subjected to corona treatment once by using a corona treatment apparatus (AGF-B10 manufactured by Kasuga Electric, Inc.) under conditions of power of 0.3 kW and a treatment speed of 3 m/minute. The horizontal alignment film forming composition was applied to a surface of a substrate subjected to corona treatment by using a bar coater. This coating was dried at 80° C. for one minute and exposure to polarized UV was conducted at an accumulated quantity of light of 100 mJ/cm$^2$ by using a polarized UV irradiation apparatus (SPOT CURE SP-7 manufactured by Ushio Inc.). A thickness of the obtained horizontal alignment film was measured with a laser microscope (LEXT manufactured by Olympus Corporation) and it was 100 nm.

In succession, the retardation layer forming composition (1) was filtered through a membrane filter (model number of T300A025A manufactured by Advantec Toyo Kaisha, Ltd.) having a pore diameter of 0.2 μm and made of PTFE in an environment at a room temperature of 25° C. and a humidity of 30% RH, and applied onto the substrate film with alignment film maintained at 25° C., by using a bar coater. This coating was dried at 120° C. for one minute. Thereafter, a layer (a λ/4 layer) obtained by curing a polymerizable liquid crystal compound was made by irradiating the coating with ultraviolet rays (at a wavelength of 365 nm in a nitrogen atmosphere, an accumulated quantity of light at the wavelength of 365 nm being 1000 mJ/cm$^2$) by using a high-pressure mercury lamp (Unicure VB-15201BY-A manufactured by Ushio Inc.). A thickness of the layer obtained by curing the polymerizable liquid crystal compound was measured with a laser microscope (LEXT manufactured by Olympus Corporation) and it was 2 μm.

A laminate (retardation layer 1) in which the layer (λ/4 layer) obtained by curing the polymerizable liquid crystal compound, the horizontal alignment film, and the substrate film were laminated in this order was thus obtained. Retardation layer 1 exhibited reverse wavelength dispersion.

[Retardation Layer 2]

A mixture obtained by mixing 2-phenoxyethyl acrylate, tetrahydrofurfuryl acrylate, dipentaerythritol triacrylate, and bis(2-vinyloxyethyl) ether at a ratio of 1:1:4:5 and adding LUCIRIN TPO as a polymerization initiator at a ratio of 4% was employed as a vertical alignment film forming composition.

A retardation layer forming composition (2) was made by preparing a photopolymerizable nematic liquid crystal compound (RMM 28B manufactured by Merck) and a solvent such that a solid content was from 1 to 1.5 g. A solvent mixture obtained by mixing methyl ethyl ketone (MEK), methyl isobutyl ketone (MIBK), and cyclohexanone (CHN) at a mass ratio (MEK:MIBK:CHN) of 35:30:35 was employed as the solvent.

A polyethylene terephthalate (PET) film having a thickness of 38 μm was prepared as a substrate film. A vertical alignment film was made by applying a vertical alignment film forming composition to one surface of the substrate film to a thickness of 3 μm and irradiating the composition with ultraviolet rays at 200 mJ/cm$^2$.

A vertical alignment layer was coated with the retardation layer forming composition (2) by die coating. An amount of coating was set to 4 to 5 g (wet). The coating was dried with a drying temperature being set to 75° C. and a drying time period being set to 120 seconds. Thereafter, the polymerizable liquid crystal compound was polymerized by irradiating the coating with ultraviolet rays (UV).

A laminate (retardation layer 2) in which a layer obtained by curing the polymerizable liquid crystal compound (a positive C layer), the vertical alignment film, and the substrate film were laminated in this order was thus obtained. A total thickness of the layer obtained by curing the polymerizable liquid crystal compound and the alignment film was 4 μm.

[Circular Polarization Plate]

A surface of the linear polarization layer on a side of the protective layer and a surface of pressure-sensitive adhesive sheet b from which the light separator had been peeled off were subjected to corona treatment and thereafter they were bonded to each other. Then, the heavy separator of pressure-sensitive adhesive sheet b was peeled off and exposed pressure-sensitive adhesive layer b and retardation layer 1 were subjected to corona treatment. Thereafter, they were bonded to each other so as to form an angle of 45° between the absorption axis of the linear polarization layer (polarizer) and the slow axis of the λ/4 layer. The substrate film of retardation layer 1 was peeled off.

Another pressure-sensitive adhesive sheet b was prepared. A surface of pressure-sensitive adhesive sheet b from which the light separator had been peeled off was subjected to corona treatment. Thereafter, retardation layer 1 and pressure-sensitive adhesive layer b were bonded to each other.

The heavy separator was peeled off from pressure-sensitive adhesive sheet b and exposed pressure-sensitive adhesive layer b and a surface of retardation layer 2 on a side of the positive C layer were bonded to each other. Thereafter, the substrate film of the positive C layer was peeled off. A circular polarization plate thus obtained was constituted of the linear polarization layer/pressure-sensitive adhesive layer b/(λ/4 layer)/pressure-sensitive adhesive layer b/the positive C layer.

<Preparation of Laminate D>

By bonding a peeling film on each of opposing surfaces of the obtained circular polarization plate, a laminate D including the circular polarization plate that constituted of the peeling film/the circular polarization plate/the peeling film was made.

<Preparation of Touch Sensor Layer E1 with PET Film>

Initially, a separation layer was formed by coating a glass plate with an acrylic resin. Then, a touch sensor laminate was made by forming a first translucent electrode layer, an interconnection (a copper pattern), a first insulating layer, a second translucent electrode layer, and a second insulating layer in this order on the separation layer.

The first translucent electrode layer, the second translucent electrode layer, and the interconnection were formed by forming a translucent electrode film or a metal film by sputtering, then forming a photoresist film pattern on the translucent electrode film or the metal film with photolithography (a photoresist application step, an exposure step, and a development step), patterning the translucent electrode film or the metal film by etching, and thereafter removing the photoresist film pattern. The translucent electrode film was vapor deposited by sputtering at an oxygen flow rate of 0 sccm, in the order of an ITO film (having a thickness of 450 Å), an APC film (having a thickness of 110 Å), and an ITO film (having a thickness of 450 Å).

Figure 5A:
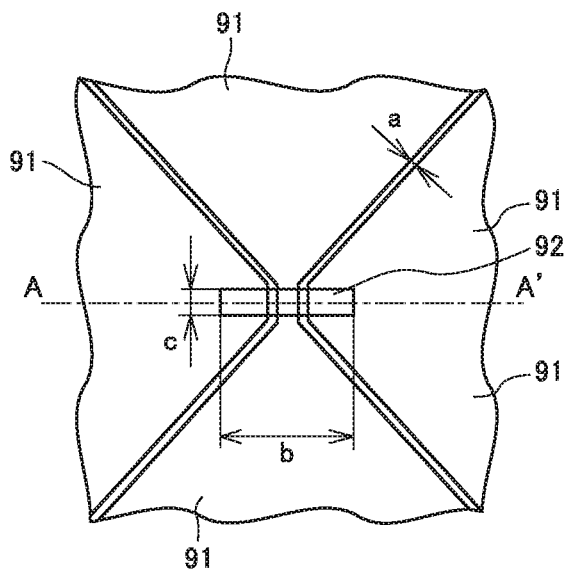
FIG. 5A is a schematic top view of a touch sensor layer.
Figure 5B:
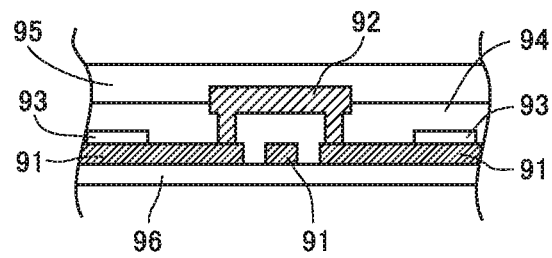
FIG. 5B is a cross-sectional view of the touch sensor layer.
Figure 6A:
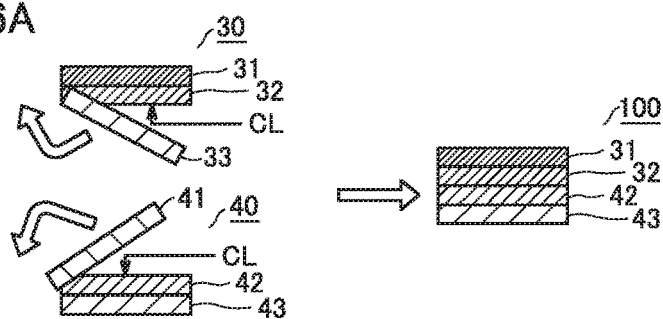
FIGS. 6A to 6E are schematic cross-sectional views showing a method of manufacturing a laminate.
Figure 6B:
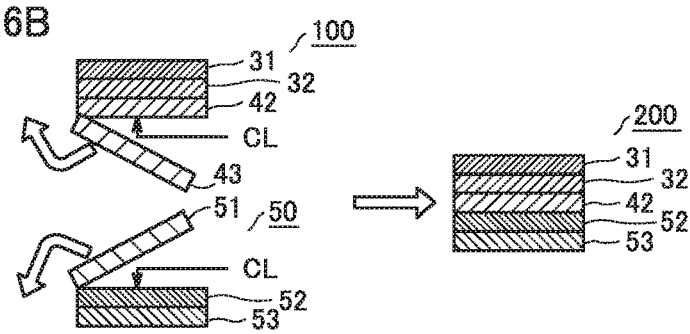
Figure 6C:
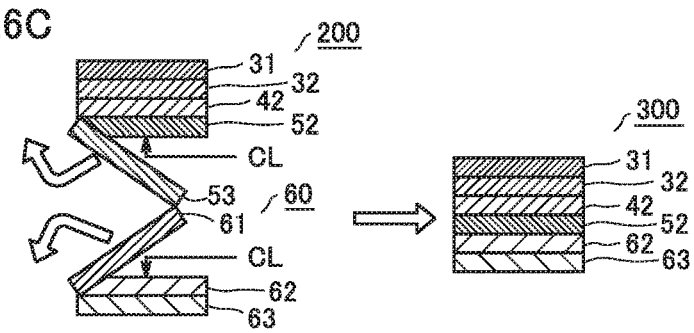
Figure 6D:
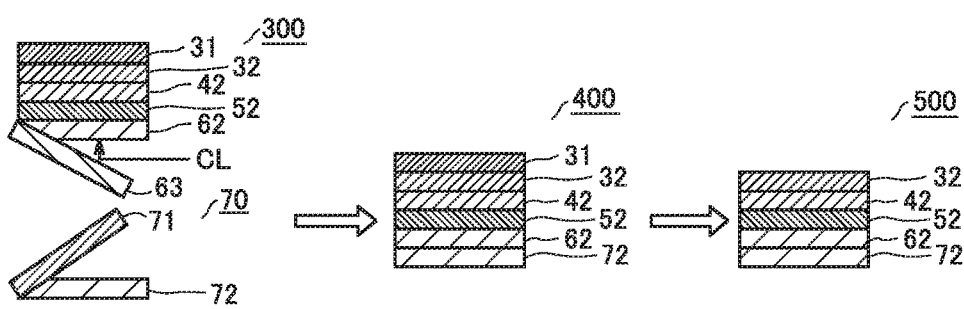
Figure 6E:
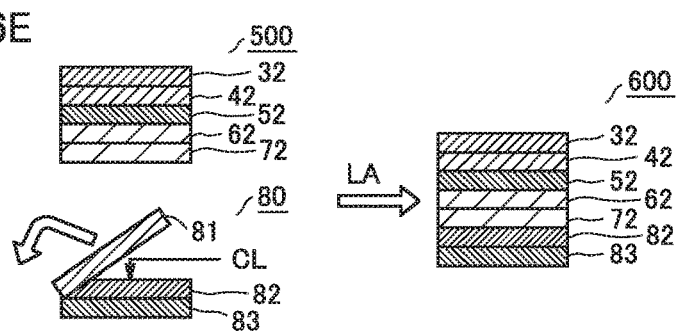

A translucent electrode layer pattern and a construction of the touch sensor layer will be described with reference to FIGS. 5A and 5B. As seen in a top view of the touch sensor layer shown in FIG. 5A, a first translucent electrode layer 91 was subjected to diamond pattern treatment in patterning of a translucent electrode film and a second translucent electrode layer 92 was patterned like a bridge that connected diamond patterns of first translucent electrode layer 91. A distance a between the diamond patterns was 10 μm and the bridge had a length b of 380 μm and a width c of 50 μm. As seen in a cross-sectional view [FIG. 5B] of the touch sensor layer along the line A-A' in FIG. 5A, first transparent conductive layer 91, an interconnection 93, a first insulating layer 94, second translucent electrode layer 92, and a second insulating layer 95 were formed on a separation layer 96 in this order. One diamond pattern had a dimension of 4.3 mm×4.2 mm.

The first insulating layer and the second insulating layer were patterned by photolithography (a step of applying an insulating layer forming composition, an exposure step, a development step, and a thermal curing step).

A touch sensor layer E with PET film was obtained by bonding a PET film with pressure-sensitive adhesive (having a thickness of 52 μm) to a surface on a side of the second insulating layer and peeling off the touch sensor laminate together with the PET film from the glass plate.

Surface resistance of the translucent electrode layer of the touch sensor layer was measured after sputtering and before patterning of the translucent electrode film for the first translucent electrode layer. Table 1 shows results.

<Preparation of Touch Sensor Layer E2 with PET Film>

A touch sensor layer E2 with PET film was obtained as in <Preparation of Touch Sensor Layer E1> except for vapor deposition of a translucent electrode film by sputtering at an oxygen flow rate of 0 sccm in the order of an ITO film (having a thickness of 400 Å), an APC film (having a thickness of 100 Å), and an ITO film (having a thickness of 400 Å).

<Preparation of Touch Sensor Layer E3 with PET Film>

A touch sensor layer E3 with PET film was obtained as in <Preparation of Touch Sensor Layer E1 with PET Film> except for vapor deposition of an ITO film (having a thickness of 1250 Å) as a translucent electrode film by sputtering at an oxygen flow rate of 0 sccm.

<Preparation of Touch Sensor Layer E4 with PET Film>

A touch sensor layer E4 with PET film was obtained as in <Preparation of Touch Sensor Layer E1 with PET Film> except for vapor deposition of an ITO film (having a thickness of 420 Å) as a translucent electrode film by sputtering at an oxygen flow rate of 30 sccm.

<Preparation of Touch Sensor Layer E5 with PET Film>

A touch sensor layer E5 with PET film was obtained as in <Preparation of Touch Sensor Layer E1 with PET Film> except for vapor deposition of an ITO film (having a thickness of 420 Å) as a translucent electrode film by sputtering at an oxygen flow rate of 0 sccm.

<Preparation of Touch Sensor Layer F1 with PET Film>

A touch sensor layer F1 with PET film was obtained by peeling off the touch sensor laminate together with the PET film from the glass plate in <Preparation of Touch Sensor Layer E3 with PET Film> described above and thereafter adhering as being in contact with the separation layer, a substrate layer (a COP film having a thickness of 13 μm) to the surface from which the touch sensor laminate had been peeled off with an adhesive layer (a photocurable adhesive) being interposed.

<Preparation of Touch Sensor Layer F2 with PET Film>

A touch sensor layer F2 with PET film was obtained by peeling off the touch sensor laminate together with the PET film from the glass plate in <Preparation of Touch Sensor Layer E3 with PET Film> described above and thereafter adhering as being in contact with the separation layer, a substrate layer (a COP film having a thickness of 23 μm) to the surface from which the touch sensor laminate had been peeled off with an adhesive layer (a photocurable adhesive) being interposed.

Example 1

A procedure for making a laminate in Example 1 will be described below with reference to FIGS. 6A to 6E. In FIGS. 6A to 6E, a reference character CL represents corona treatment and a reference character LA represents joint.

A laminate A 30 constituted of a peeling film 31, a front plate A 32, and a peeling film 33 and a pressure-sensitive adhesive sheet a 40 constituted of a light separator 41, a first bonding layer 42 formed from pressure-sensitive adhesive layer a, and a heavy separator 43 were prepared. Laminate 100 including peeling film 31, front plate A 32, first bonding layer 42 made from pressure-sensitive adhesive layer a, and heavy separator 43 in this order was obtained (FIG. 6A) by subjecting a surface of laminate A 30 from which peeling film 33 had been peeled off and a surface of pressure-sensitive adhesive sheet a 40 from which light separator 41 had been peeled off to corona treatment and bonding the surfaces to each other.

A laminate D 50 constituted of a peeling film 51, a circular polarization plate 52, and a peeling film 53 was prepared. A laminate 200 including peeling film 31, front plate A 32, first bonding layer 42, circular polarization plate 52, and peeling film 53 in this order was obtained (FIG. 6B) by subjecting a surface, of laminate 100 from which heavy separator 43 had been peeled off and a surface of laminate D 50 from which peeling film 51 had been peeled off to corona treatment and thereafter bonding the surfaces to each other.

A pressure-sensitive adhesive sheet a 60 constituted of a light separator 61, a second bonding layer 62 formed from pressure-sensitive adhesive layer a, and a heavy separator 63 was prepared. A laminate 300 including peeling film 31, front plate A 32, first bonding layer 42, circular polarization plate 52, second bonding layer 62 formed from pressure-sensitive adhesive layer a, and heavy separator 63 in this order was obtained (FIG. 6C) by subjecting a surface of laminate 200 from which peeling film 53 had been peeled off and a surface of pressure-sensitive adhesive sheet a 60 from which light separator 61 had been peeled off to corona treatment and thereafter bonding the surfaces to each other.

Touch sensor layer E1 with PET film described above was prepared as a touch sensor layer 70 with PET film, and a PET film 71 with pressure-sensitive adhesive was peeled off from touch sensor layer 70 with PET film. A laminate 400 including peeling film 31, front plate A 32, first bonding layer 42, circular polarization plate 52, second bonding layer 62, and a touch sensor layer 72 in this order was obtained (FIG. 6D) by subjecting a surface of laminate 300 from which heavy separator 63 had been peeled off to corona treatment and bonding the surface to touch sensor layer 72. Then, a laminate 500 including front plate A 32, first bonding layer 42, circular polarization plate 52, second bonding layer 62, and touch sensor layer 72 in this order was obtained (FIG. 6D) by peeling off peeling film 31 from laminate 400.

A pressure-sensitive adhesive sheet 80 constituted of a light separator 81, a pressure-sensitive adhesive layer 82 formed from pressure-sensitive adhesive 1, and a heavy separator 83 was prepared. A laminate 600 including front plate A 32, first bonding layer 42, circular polarization plate 52, second bonding layer 62, and touch sensor layer 72 as well as pressure-sensitive adhesive layer 82 and heavy separator 83 in this order was obtained (FIG. 6E) by subjecting a surface of pressure-sensitive adhesive sheet 80 from which light separator 81 had been peeled off to corona treatment and thereafter bonding the surface to touch sensor layer 72 of laminate 500. Table 1 shows results. Visibility of a touch sensor pattern was evaluated as "A".

Examples 2 to 10 and Comparative Examples 1 to 3

A laminate was made as in Example 1 except that pressure-sensitive adhesive 1 making up pressure-sensitive adhesive layer 82 in Example 1 was changed to a pressure-sensitive adhesive making up a pressure-sensitive adhesive layer shown in Table 1 and/or touch sensor layer 72 was changed to a touch sensor layer shown in Table 1. Visibility of the touch sensor pattern was evaluated as "A" in each case.

TABLE 1

|  | Example | | | | | | |
| --- | --- | --- | --- | --- | --- | --- | --- |
|  | 1 | 2 | 3 | 4 | 5 | 6 | 7 |
| Touch Sensor Layer | E1 | E2 | E2 | E3 | E3 | E4 | E3 |
| Presence of Substrate Layer of Touch Sensor Layer | No | No | 5o | No | No | No | No |
| Surface Resistance of Translucent Conductive Layer [Ω/□] | 5 | 10 | 10 | 40 | 40 | 90 | 40 |
| Thickness of Pressure-Sensitive Adhesive Layer [μm] | 5 | 10 | 35 | 50 | 70 | 70 | 70 |
| Pressure-Sensitive Adhesive Contained in Pressure-Sensitive Adhesive Layer | Pressure-Sensitive Adhesive 1 | Pressure-Sensitive Adhesive 1 | Pressure-Sensitive Adhesive 1 | Pressure-Sensitive Adhesive 1 | Pressure-Sensitive Adhesive 1 | Pressure-Sensitive Adhesive 1 | Pressure-Sensitive Adhesive 2 |
| Relative Permittivity of Pressure-Sensitive Adhesive Layer | 2.17 | 2.17 | 2.17 | 2.17 | 2.17 | 2.17 | 3.0 |
| Capacitance C [pF] | 350 | 175 | 98 | 80 | 70 | 71 | 71 |
| Response Speed [μsecond] | 2.5 | 2.3 | 2.2 | 2.3 | 2.1 | 2.5 | 2.4 |
| Bendability | A | A | A | A | A | A | A |

TABLE 1-continued

|  | Example | | | Comparative Example | | |
| --- | --- | --- | --- | --- | --- | --- |
|  | 8 | 9 | 10 | 1 | 2 | 3 |
| Touch Sensor Layer | E3 | F1 | F2 | E3 | E3 | E5 |
| Presence of Substrate Layer of Touch Sensor Layer | No | Yes | Yes | No | No | No |
| Surface Resistance of Translucent Conductive Layer [Ω/□] | 40 | 40 | 40 | 40 | 40 | 100 |
| Thickness of Pressure-Sensitive Adhesive Layer [μm] | 70 | 50 | 50 | 70 | 100 | 25 |
| Pressure-Sensitive Adhesive Contained in Pressure-Sensitive Adhesive Layer | Pressure-Sensitive Adhesive 3 | Pressure-Sensitive Adhesive 1 | Pressure-Sensitive Adhesive 1 | Pressure-Sensitive Adhesive 4 | Pressure-Sensitive Adhesive 1 | Pressure-Sensitive Adhesive 1 |
| Relative Permittivity of Pressure-Sensitive Adhesive Layer | 3.5 | 2.17 | 2.17 | 4.77 | 2.17 | 2.17 |
| Capacitance C [pF] | 70 | 74 | 70 | 150 | 61 | 120 |
| Response Speed [μsecond] | 2 | 2.2 | 2.1 | 3.3 | 2.0 | 3.8 |
| Bendability | A | A | A | A | B | A |

REFERENCE SIGNS LIST

10, 20, 100, 200, 300, 400, 500, 600, 700 laminate; 11 optical film; 12 touch sensor layer; 13 pressure-sensitive adhesive layer; 14 translucent electrode layer; 21 front plate; 22 first bonding layer; 23 second bonding layer; 24 organic EL display element; 30 laminate A; 31, 33, 51, 53 peeling film; 32 front plate A; 40, 60 pressure-sensitive adhesive sheet a; 41, 61, 81 light separator; 42 first bonding layer; 43, 63, 83 heavy separator; 50 laminate D; 52 circular polarization plate; 62 second bonding layer; 70 touch sensor layer with PET film; 71 PET film with pressure-sensitive adhesive; 72 touch sensor layer; 80 pressure-sensitive adhesive sheet; 82 pressure-sensitive adhesive layer; 91 first translucent electrode layer; 92 second translucent electrode layer; 93 interconnection; 94 first insulating layer; 95 second insulating layer; 96 separation layer; 803 guard electrode; 804 measurement sample; 805 main electrode; 806 counter electrode; C1, C2 distance; CL corona treatment; LA joint

What is claimed is:

1. A laminate comprising:
   an optical film;
   a touch sensor layer including a translucent electrode layer; and
   a pressure-sensitive adhesive layer being provided on a surface of the touch sensor layer opposite to the optical film,
   the laminate satisfying expressions (1) to (3):

surface resistance of the translucent electrode layer ≤ 90 Ω/□    (1)

relative permittivity of the pressure-sensitive adhesive layer at a frequency of 100 kHz ≤ 3.5    (2)

5 μm ≤ a thickness of the pressure-sensitive adhesive layer ≤ 50 μm    (3).

2. The laminate according to claim 1, further comprising a front plate arranged on a side of the optical film opposite to the touch sensor layer.

3. The laminate according to claim 1, wherein the optical film includes a circular polarization plate.

4. The laminate according to claim 1, further comprising an organic EL display element arranged on a side of the pressure-sensitive adhesive layer opposite to the touch sensor layer.

5. The laminate according to claim 1, wherein the touch sensor layer includes a capacitance coupling type touch sensor panel.

6. An image display device comprising the laminate according to claim 1.

7. The laminate according to claim 1, wherein the relative permittivity of the pressure-sensitive adhesive layer at a frequency of 100 kHz is higher than 1.0 and not higher than 2.5.

8. The laminate according to claim 2, wherein the optical film includes a circular polarization plate.

9. The laminate according to claim 8, further comprising an organic EL display element arranged on a side of the pressure-sensitive adhesive layer opposite to the touch sensor layer.

10. The laminate according to claim 9, wherein the touch sensor layer includes a capacitance coupling type touch sensor panel.

11. An image display device comprising the laminate according to claim 10.

* * * * *